(12) United States Patent
Charpentier et al.

(10) Patent No.: US 11,043,929 B2
(45) Date of Patent: Jun. 22, 2021

(54) METHOD AND SYSTEM FOR GAIN CONTROL IN A COMMUNICATIONS DEVICE

(71) Applicant: NXP B.V., Eindhoven (NL)

(72) Inventors: Steve Charpentier, Antibes (FR); Stefan Mendel, Graz (AT); Ulrich Andreas Muehlmann, Graz (AT); Helmut Kranabenter, Graz (AT)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 16/702,793

(22) Filed: Dec. 4, 2019

(65) Prior Publication Data
US 2020/0204133 A1 Jun. 25, 2020

(30) Foreign Application Priority Data
Dec. 19, 2018 (EP) .................................. 18306752

(51) Int. Cl.
| | |
|---|---|
| H03G 3/30 | (2006.01) |
| H03G 3/00 | (2006.01) |
| H03M 1/18 | (2006.01) |
| H04L 27/08 | (2006.01) |
| H04W 52/52 | (2009.01) |

(52) U.S. Cl.
CPC .......... *H03G 3/3052* (2013.01); *H03G 3/001* (2013.01); *H03M 1/185* (2013.01); *H03M 1/188* (2013.01); *H04L 27/08* (2013.01); *H04W 52/52* (2013.01); *H03G 2201/702* (2013.01)

(58) Field of Classification Search
USPC .......................................................... 341/139
See application file for complete search history.

(56) References Cited

U.S. PATENT DOCUMENTS

| | | | | |
|---|---|---|---|---|
| 2008/0014895 | A1* | 1/2008 | Li ......................... | H03G 3/3089 455/324 |
| 2008/0293370 | A1* | 11/2008 | Wood .................... | H03G 3/3068 455/250.1 |
| 2010/0284450 | A1 | 11/2010 | Ejima | |
| 2012/0263329 | A1* | 10/2012 | Kjeldsen ................ | H03M 1/185 381/315 |
| 2015/0162924 | A1* | 6/2015 | Takaike ................. | H03M 1/186 341/118 |
| 2015/0358187 | A1* | 12/2015 | Chou ..................... | H04L 27/08 375/345 |
| 2018/0123627 | A1* | 5/2018 | Myoung ................ | H04B 5/0075 |

OTHER PUBLICATIONS

European Search Reports & Written Opinion for Application EP18306752.9 dated Jun. 2019.*

* cited by examiner

*Primary Examiner* — Khai M Nguyen

(57) ABSTRACT

Embodiments of methods and systems for gain control in a communications device are described. In an embodiment, a method for gain control in a communications device involves detecting a change in an amplification gain that is applied to an analog signal in the communications device and compensating for the change in the amplification gain by manipulating an amplitude of a digital signal that is converted from the analog signal. Other embodiments are also described.

9 Claims, 10 Drawing Sheets

METHOD AND SYSTEM FOR GAIN CONTROL IN A COMMUNICATIONS DEVICE

CROSS-REFERENCE TO RELATED APPLICATIONS

This application claims priority under 35 U.S.C. § 119 to European Patent Application No. 18306752.9, filed on Dec. 19, 2018, the contents of which are incorporated by reference herein.

BACKGROUND

Communications devices that communicate with each other wirelessly may experience long distance communications with bad channel conditions as well as close distance communications with good channel conditions. Consequently, wireless communications devices typically use amplifiers to amplify signals. However, changing the configuration of an amplifier, for example, the amplification gain of the amplifier can cause unexpected signal change, corrupt a data frame and result in data reception errors.

SUMMARY

Embodiments of methods and systems for gain control in a communications device are described. In an embodiment, a method for gain control in a communications device involves detecting a change in an amplification gain that is applied to an analog signal in the communications device and compensating for the change in the amplification gain by manipulating an amplitude of a digital signal that is converted from the analog signal. Other embodiments are also described.

In an embodiment, compensating for the change in the amplification gain by manipulating the amplitude of the digital signal that is converted from the analog signal involves freezing the amplitude of the digital signal during a time window in which the change in the amplification gain affects the amplitude of the digital signal.

In an embodiment, compensating for the change in the amplification gain by manipulating the amplitude of the digital signal that is converted from the analog signal further involves measuring a gap in the amplitude of the digital signal during the time window that is caused by the change in the amplification gain.

In an embodiment, compensating for the change in the amplification gain by manipulating the amplitude of the digital signal that is converted from the analog signal further involves removing the gap in the amplitude of the digital signal during the time window.

In an embodiment, compensating for the change in the amplification gain by manipulating the amplitude of the digital signal that is converted from the analog signal involves manipulating the amplitude of the digital signal prior to a start of a data frame reception.

In an embodiment, compensating for the change in the amplification gain by manipulating the amplitude of the digital signal that is converted from the analog signal involves manipulating the amplitude of the digital signal during a data frame reception.

In an embodiment, compensating for the change in the amplification gain by manipulating the digital signal that is converted from the analog signal involves compensating for the change in the amplification gain by manipulating the digital signal prior to signal edge detection of the digital signal.

In an embodiment, the analog signal is a baseband analog signal that is converted from a Radio frequency (RF) signal.

In an embodiment, the communications device is a near field communications (NFC) device.

In an embodiment, a communications device includes a gain compensation timing unit configured to detect a change in an amplification gain that is applied to an analog signal in the communications device and a signal amplitude control unit configured to compensate for the change in the amplification gain by manipulating an amplitude of a digital signal that is converted from the analog signal.

In an embodiment, the signal amplitude control unit is further configured to freeze the amplitude of the digital signal during a time window in which the change in the amplification gain affects the amplitude of the digital signal.

In an embodiment, the signal amplitude control unit is further configured to measure a gap in the amplitude of the digital signal during the time window that is caused by the change in the amplification gain.

In an embodiment, the signal amplitude control unit is further configured to remove the gap in the amplitude of the digital signal during the time window.

In an embodiment, the signal amplitude control unit is further configured to manipulate the amplitude of the digital signal prior to a start of a data frame reception. In an embodiment, the signal amplitude control unit is further configured to manipulate the amplitude of the digital signal during a data frame reception.

In an embodiment, the signal amplitude control unit is further configured to compensate for the change in the amplification gain by manipulating the digital signal prior to signal edge detection of the digital signal.

In an embodiment, the analog signal is a baseband analog signal that is converted from an RF signal.

In an embodiment, the communications device is an NFC device.

In an embodiment, a method for gain control in an NFC device involves detecting a change in an amplification gain that is applied to an analog signal in the NFC device and compensating for the change in the amplification gain by manipulating an amplitude of a digital signal that is converted from the analog signal, prior to signal edge detection of the digital signal.

In an embodiment, compensating for the change in the amplification gain by manipulating the amplitude of the digital signal that is converted from the analog signal, prior to signal edge detection of the digital signal, involves freezing the amplitude of the digital signal during a time window in which the change in the amplification gain affects the amplitude of the digital signal and measuring a gap in the amplitude of the digital signal during the time window that is caused by the change in the amplification gain.

Other aspects and advantages of embodiments of the present invention will become apparent from the following detailed description, taken in conjunction with the accompanying drawings, depicted by way of example of the principles of the invention.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
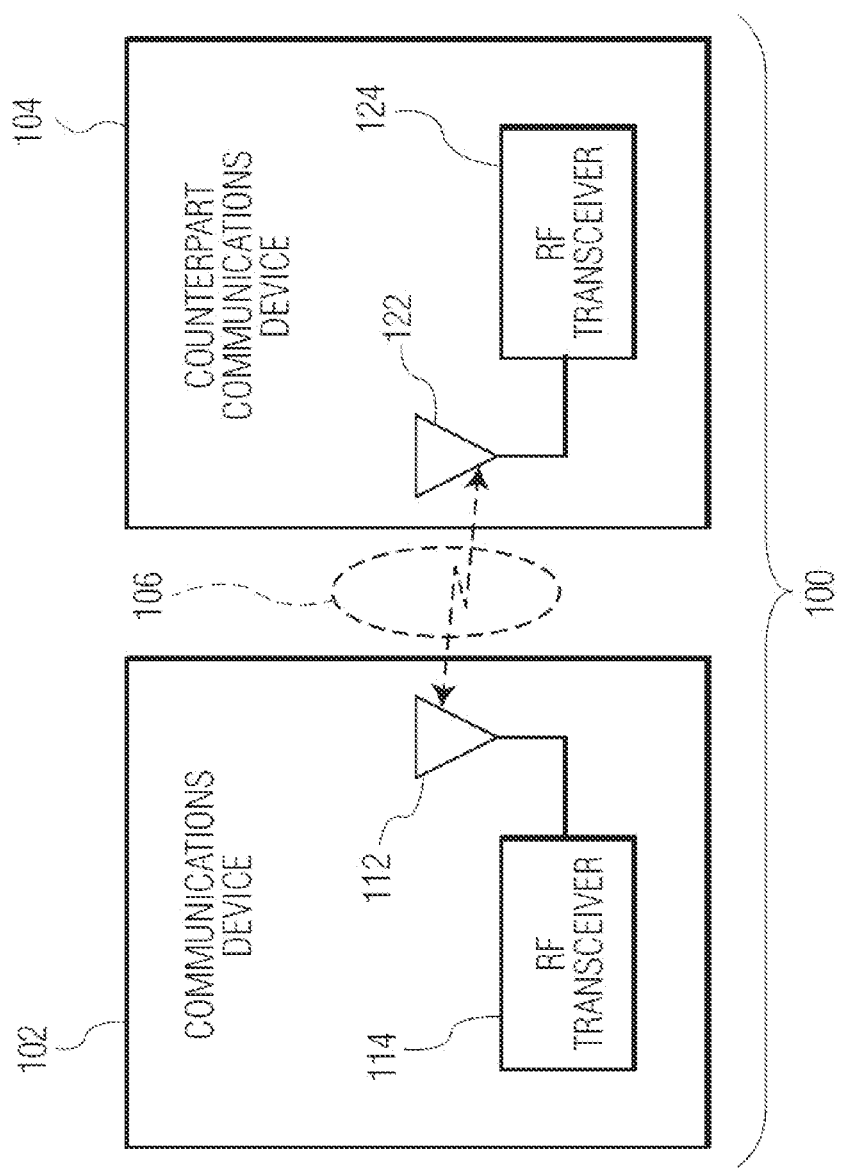
FIG. 1 depicts an embodiment of a communications device that can be used with a counterpart communications device to form a communications system.

FIG. 1 depicts an embodiment of a communications device 102 that can be used with a counterpart communications device 104 to form a communications system 100. In the communications system depicted in FIG. 1, the communications device 102 communicates with the counterpart communications device 104 via a communications channel 106. In some embodiments, the communications device 102 is a card/transponder device or the communications device 102 is in a "card-mode" in which the communications device 102 behaves as a card/transponder device and the counterpart communications device 104 is a dedicated reader device or a communications device in "reader-mode" in which the counterpart communications device 104 behaves as a reader device. In some other embodiments, the communications device 102 is a reader device or the communications device is in a reader mode and the counterpart communications device 104 is a dedicated card device or a communications device in card-mode.

In the embodiment depicted in FIG. 1, the communications device 102 includes an antenna 112 and an RF transceiver 114 configured to receive incoming RF signals from the antenna and/or to transmit outgoing RF signals through the antenna. The antenna may be any suitable type of antenna. In some embodiments, the antenna is an induction type antenna such as a loop antenna or any other suitable type of induction type antenna. However, the antenna is not limited at an induction type antenna. The communications device may be fully or partially implemented as an integrated circuit (IC) device. In some embodiments, the communications device is a handheld computing system or a mobile computing system, such as a mobile phone that includes one or more IC devices. Although the illustrated communications device is shown with certain components and described with certain functionality herein, other embodiments of the communications device 102 may include fewer or more components to implement the same, less, or more functionality.

In some embodiments, the communications device 102 communicates with other communications devices (e.g., the counterpart communications device 104) via inductive coupling. For example, the communications device 102 is a near field communications (NFC) device that uses magnetic field induction for communications in close proximity. The communications device 102 can be configured for either passive load modulation (PLM) or active load modulation (ALM). In some embodiments, the communications device is implemented as an RF transponder that is compatible with the International Organization for Standardization (ISO)/the International Electrotechnical Commission (IEC) 14443 standard that may operate at 13.56 MHz. In these embodiments, the antenna 112 is an induction type antenna such as a loop antenna or any other suitable type of induction type antenna.

In the embodiment depicted in FIG. 1, the counterpart communications device 104 includes an antenna 122 and an RF transceiver 124 configured to receive incoming RF signals from the antenna 122 and/or to transmit outgoing RF signals through the antenna 122. The antenna may be any suitable type of antenna. In some embodiments, the antenna is an induction type antenna such as a loop antenna or any other suitable type of induction type antenna. However, the antenna is not limited at an induction type antenna. The counterpart communications device 104 may be fully or partially implemented as an IC device. In some embodiments, the counterpart communications device is a handheld computing system or a mobile computing system, such as a mobile phone. Although the illustrated counterpart communications device is shown with certain components and described with certain functionality herein, other embodiments of the counterpart communications device may include fewer or more components to implement the same, less, or more functionality.

In some embodiments, the counterpart communications device 104 communicates with other communications devices (e.g., the communications device 102) via inductive coupling. For example, the counterpart communications device 104 is an NFC device that uses magnetic field induction for communications in close proximity. The counterpart communications device can be configured for either PLM or ALM. In some embodiments, the counterpart communications device is implemented as an RF transponder that is compatible with the ISO/IEC 14443 standard that may operate at 13.56 MHz. In the embodiments, the antenna 122 is an induction type antenna such as a loop antenna or any other suitable type of induction type antenna.

In an example operation of the communications system 100, an RF signal is received by the antenna 112 of the communications device 102 from the antenna 122 of the counterpart communications device 104 and is passed to the RF transceiver 114 of the communications device 102 to convert the RF signal into a digital signal, which can be further processed by a digital processor. A signal may be generated in response to the RF signal and is used to produce an outgoing RF signal at the RF transceiver 114, which may be transmitted to the counterpart communications device using the antenna 112.

Figure 2:
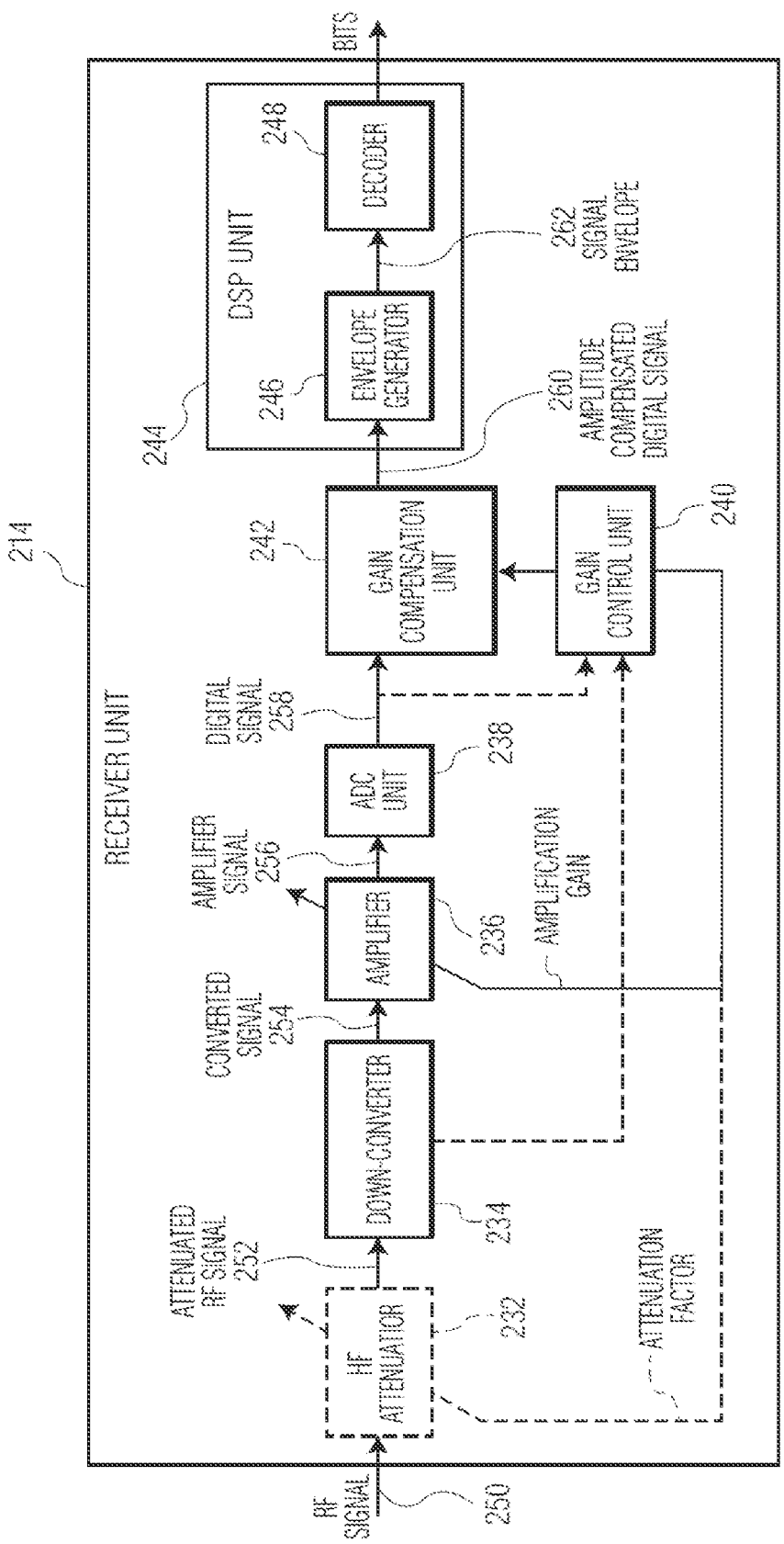
FIG. 2 depicts an embodiment of a receiver unit, which may be an embodiment of a Radio Frequency (RF) transceiver of the communications device and/or an RF transceiver of the counterpart communications device depicted in FIG. 1.

FIG. 2 depicts a receiver unit 214 that is an embodiment of the RF transceiver 114 of the communications device 102 and/or the RF transceiver 124 of the counterpart communications device 104 depicted in FIG. 1. In the embodiment of FIG. 2, the receiver unit includes an optional high frequency (HF) attenuator 232, a down-converter 234, an amplifier 236, an analog-to-digital converter (ADC) unit 238, a gain control unit 240, a gain compensation unit 242 and a digital signal processing (DSP) unit 244. Each of the gain control unit, the gain compensation unit and the DSP unit may be implemented as hardware, software, firmware, and/or a combination of hardware, software, and/or firmware. In some embodiments, at least one of the gain control unit, the gain compensation unit and the DSP unit is implemented as a processor such as a microcontroller or a central processing unit (CPU). The receiver unit depicted in FIG. 2 is a possible implementation of the RF transceiver 114 or 124 depicted in FIG. 1. However, the RF transceiver 114 or 124 depicted in FIG. 1 can be implemented differently from the receiver unit depicted in FIG. 2. Although the illustrated receiver unit is shown with certain components and described with certain functionality herein, other embodiments of the receiver unit may include fewer or more components to implement the same, less, or more functionality. For example, although the receiver unit is depicted in FIG. 2 as including the HF attenuator, in some embodiments, the receiver unit does not include the HF attenuator.

Wireless communications devices typically employ amplification gain control to adapt to long distance communications with bad channel conditions as well as close distance communications with good channel conditions. However, changing the amplification gain can cause unexpected signal change, corrupt a data frame and result in data reception errors. For example, a change in the amplification gain for an amplifier can cause a step (e.g., increase or decreases) in the amplitude of a resulting digital signal. An amplitude step in a digital signal can be incorrectly decoded as a change in the signal envelope of the digital signal. In addition, an amplitude step in a digital signal can mask out a real envelope change, which may result in an incorrectly decoded signal. Compared to an RF receiver that changes the amplification gain (also known as amplifier gain switching) without proper amplification gain compensation, thus corrupting a data frame during the reception of the data frame, the receiver unit 214 depicted in FIG. 2 can perform amplification gain compensation prior to the reception of a data frame as well as during the reception of a data frame. Consequently, the receiver unit depicted in FIG. 2 can reduce or minimize signal reception errors and can decrease the possibility of failure in the reception of a data frame. Thus, the performance and robustness of the receiver unit depicted in FIG. 2 may be improved relative to the performance and robustness of an RF receiver that changes the amplification gain without proper amplification gain compensation.

In the embodiment of FIG. 2, the HF attenuator 232 is configured to attenuate a received RF signal 250 to generate an attenuated RF signal 252. The HF attenuator may attenuate the received RF signal based on an input (e.g., an attenuation factor) from the gain control unit. In some embodiments, the RF input signal is received from the antenna 112 or the antenna 122. For example, the RF input signal may be received from an induction type antenna such as a loop antenna. In some embodiments, the receiver unit 214 does not include the HF attenuator and the received RF signal is directly input into the down-converter.

In the embodiment of FIG. 2, the down-converter 234 is configured to convert an RF signal into a converted signal (e.g., a baseband signal) 254 having a frequency that is lower than the frequency of the RF signal. For example, when the HF attenuator 232 is included in the receiver unit, the down-converter may be configured to convert the attenuated RF signal 252 from the HF attenuator into the converted signal. When the HF attenuator is not included in the receiver unit, the down-converter may be configured to convert the received RF signal 250 into the converted signal. The down-converter may be implemented by a mixer and/or other known analog down converting circuit. In some embodiments, the down-converter is a baseband convert configured to convert the RF signal into a baseband signal.

In the embodiment of FIG. 2, the amplifier 236 is configured to amplify the converted signal 254 to generate an amplified signal 256 based on an input (e.g., an amplification gain) from the gain control unit. In some embodiments, the amplifier is a baseband amplifier (BBA) configured to amplify a baseband signal produced by the down-converter based on an amplification gain from the gain control unit to generate an amplified signal. In the embodiment of FIG. 2, the ADC unit 238 is configured to convert the amplified signal into a digital signal 258. The ADC unit may be implemented with one or more suitable analog circuits.

In the embodiment of FIG. 2, the gain control unit 240 is configured to control the amplification gain of the amplifier 236 and/or the attenuation factor of the HF attenuator 232.

In some embodiments, the gain control unit is configured to control the amplification gain of the amplifier and/or the attenuation factor of the HF attenuator based on a received signal strength indicator (RSSI) value, which may be received from the down-converter 234 and/or the ADC unit 238. In some embodiments, the amplifier control unit is configured to switch the amplification gain of the amplifier and/or the attenuation factor of the HF attenuator between multiple predefined values based on an RSSI value history (e.g., a current RSSI value and/or at least a previous RSSI value). In some embodiments, the gain control unit is configured to compare the RSSI value with a threshold and to switch the amplification gain of the amplifier and/or the attenuation factor of the HF attenuator if the RSSI value is larger than or smaller than the threshold. In some embodiments, the gain control unit includes an RSSI unit configured to obtain an RSSI value based on an amplitude of the RF signal. In an embodiment, the RSSI unit obtains the RSSI value based on an amplitude of a component of the RF signal. For example, the RSSI unit obtains the RSSI value based on a DC value of a down-converted version of the RF signal. In an embodiment, the RSSI unit obtains the RSSI value based on the digital signal that is generated by the ADC unit. The RSSI value may be a number such as an integer. The amplitude of the RF signal may be a voltage of the RF signal and/or a current of the RF signal. In some embodiments, the RSSI value has a non-linear relationship with the amplitude of the RF signal. For example, an RSSI value of 30 may be associated with an amplitude of 2V while an RSSI value of 35 may be associated with an amplitude of 3V.

In the embodiment of FIG. 2, the gain compensation unit 242 is configured to detect a change in an amplification gain that is applied to an analog signal in the communications device 102 or 104 and to compensate for the change in the amplification gain by manipulating an amplitude of a digital signal that is converted from the analog signal. Because the gain compensation unit manipulates the amplitude of the digital signal to compensate for the change in the amplification gain, a step (e.g., increase or decreases) on the amplitude of a resulting digital signal that is caused by a change in the amplification gain can be measured and removed by the gain compensation unit. Consequently, decoding errors that are caused by a change in the signal envelope of the digital signal can be reduced or avoided. In addition, decoding errors that are caused by an actual signal edge that is masked out by an amplitude step in the digital signal can be reduced or avoided. In some embodiments, the analog signal is the baseband analog signal 254 that is converted from the received RF signal 252 by the down-converter 234 and the gain compensation unit is configured to detect a change in an amplification gain of the amplifier 236 for amplifying the baseband analog signal and to compensate for the change in the amplification gain by manipulating the amplitude of the digital signal that is converted from the analog signal by the ADC unit. The gain compensation unit can generate an amplitude compensated digital signal 260. In some embodiments, the gain compensation unit manipulates the amplitude of the digital signal prior to a start of a data frame reception and/or during a data frame reception. In some embodiments, the gain compensation unit is configured to manipulate the amplitude of the digital signal prior to signal edge detection of the digital signal.

In some embodiments, the gain compensation unit 242 is configured to freeze the amplitude of the digital signal 258 during a time window in which the change in the amplification gain affects the amplitude of the digital signal. In an embodiment, the gain compensation unit is configured to measure a gap in the amplitude of the digital signal during the time window that is caused by the change in the amplification gain. In an embodiment, the gain compensation unit is configured to adjust or remove the gap in the amplitude of the digital signal during the time window.

In the embodiment of FIG. 2, the DSP unit 244 is configured to process the amplitude compensated digital signal 260 that is generated by the gain compensation unit 242 to generate processed bits. The DSP unit may include an envelope generator 246 configured to generate a signal envelope 262 of the digital signal and a decoder 248 configured to decode the signal envelope into decoded bits. The envelope generator and/or the decoder may be implemented as hardware, software, firmware, and/or a combination of hardware, software, and/or firmware. In some embodiments, the envelope generator and/or the decoder is implemented with one or more suitable digital logic circuits. In an embodiment, the envelope generator and/or the decoder is implemented as a processor such as a microcontroller or a CPU.

Figure 3:
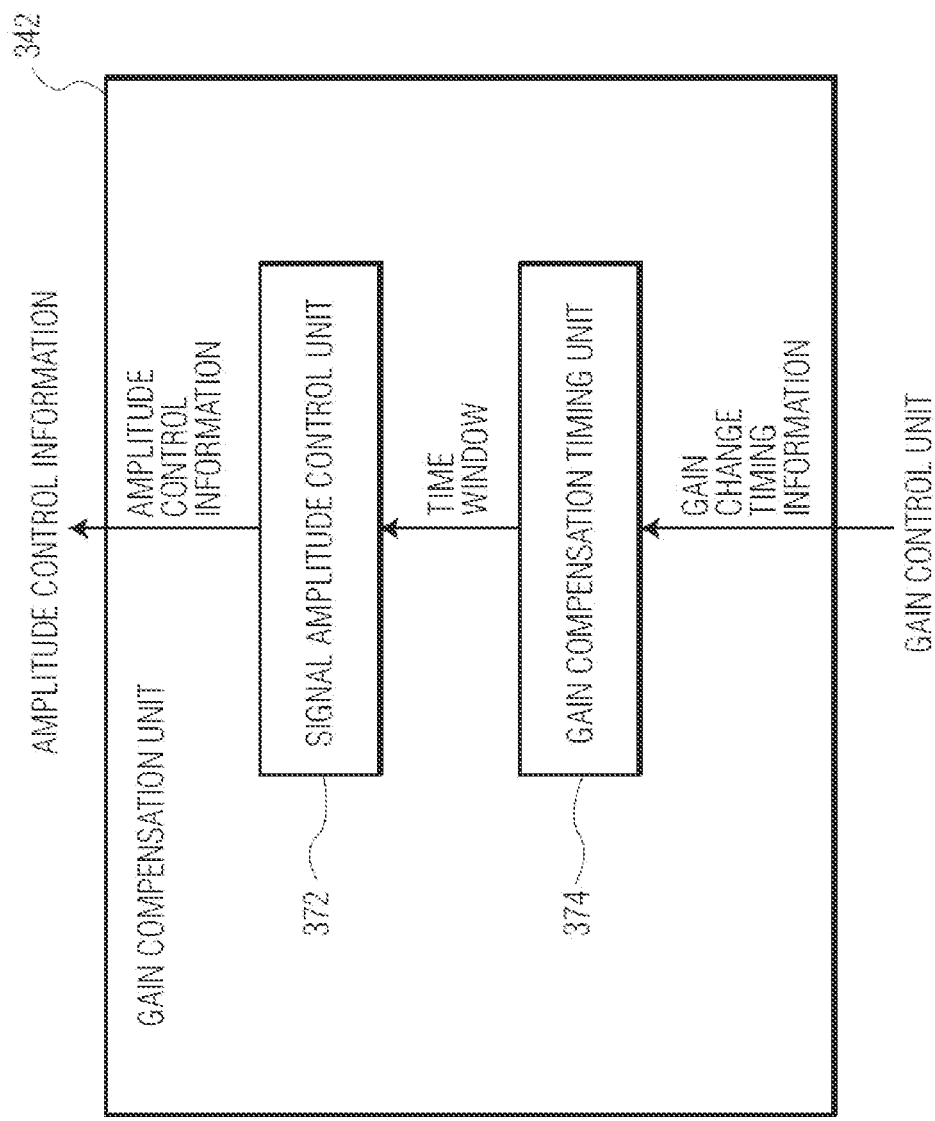
FIG. 3 depicts an embodiment of a gain compensation unit of the receiver unit depicted in FIG. 2.

FIG. 3 depicts an embodiment of the gain compensation unit 242 of the receiver unit 214 depicted in FIG. 2. In the embodiment of FIG. 3, a gain compensation unit 342 includes a signal amplitude control unit 372 and a gain compensation timing unit 374. Each of the gain compensation timing unit and the signal amplitude control unit may be implemented as hardware, software, firmware, and/or a combination of hardware, software, and/or firmware. In some embodiments, at least one of the gain compensation timing unit and the signal amplitude control unit is implemented as a processor such as a microcontroller or a CPU. The gain compensation unit depicted in FIG. 3 is a possible implementation of the gain compensation unit depicted in FIG. 2. However, the gain compensation unit depicted in FIG. 2 can be implemented differently from the receiver unit depicted in FIG. 3.

In the embodiment of FIG. 3, the gain compensation timing unit 374 is configured to obtain a time window in which a change in an amplification gain that is applied to an analog signal in the receiver unit 214 affects the amplitude of a digital signal that is converted from the analog signal. For example, the gain compensation timing unit is configured to obtain a time window in which a change in an amplification gain that is applied to a baseband analog signal that is input into the amplifier 236 affects the amplitude of a digital signal that is generated by the ADC unit 238. The gain compensation timing unit may be implemented with one or more suitable digital logic circuits. In some embodiments, the gain compensation timing unit receives information regarding the time window (e.g., a gain change time point at which the gain control unit 240 changes (increases or decreases) the amplification gain) from the gain control unit 240. The gain change time point may occur prior to a start of a data frame reception or during a data frame reception. In an embodiment, the gain compensation timing unit receives a gain change time point at which the gain control unit changes (increases or decreases) the amplification gain of the amplifier and calculates a delay in which the amplification gain change affects the amplitude of the digital signal that is generated by the ADC unit. In some embodiments, the gain compensation timing unit includes a delay circuit that is implemented with one or more suitable logic circuits and that is configured to generate a delay in which the amplification gain change affects the amplitude of the digital signal.

In the embodiment of FIG. 3, the signal amplitude control unit 372 is configured to control the amplitude of the digital signal (e.g., the digital signal 258) during the time window that is obtained by the gain compensation timing unit 374. In some embodiments, the signal amplitude control unit is configured to freeze the amplitude of the digital signal during the obtained time window. In an embodiment, the signal amplitude control unit is configured to measure a gap in the amplitude of the digital signal during the time window and to adjust or remove the gap in the amplitude of the digital signal during the time window.

Figure 5:
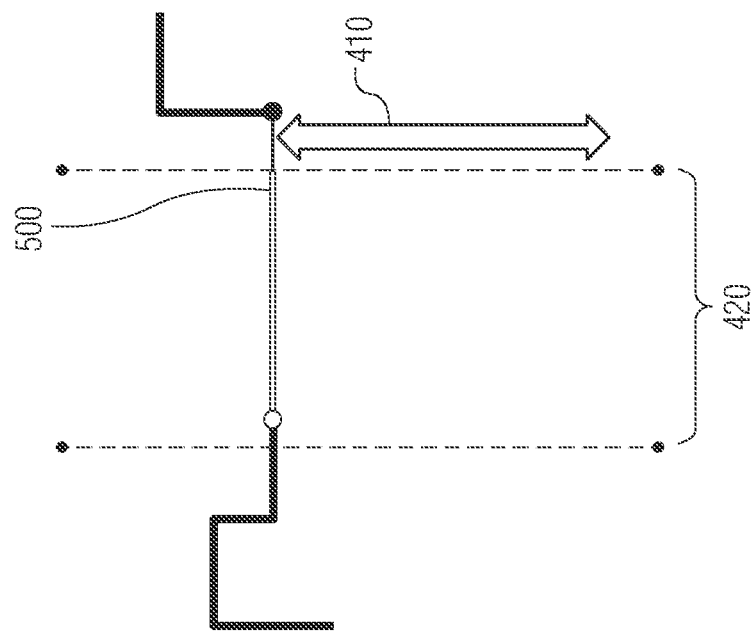
FIG. 5 depicts an example of an amplitude compensated digital signal in the receiver unit depicted in FIG. 2.
Figure 4:
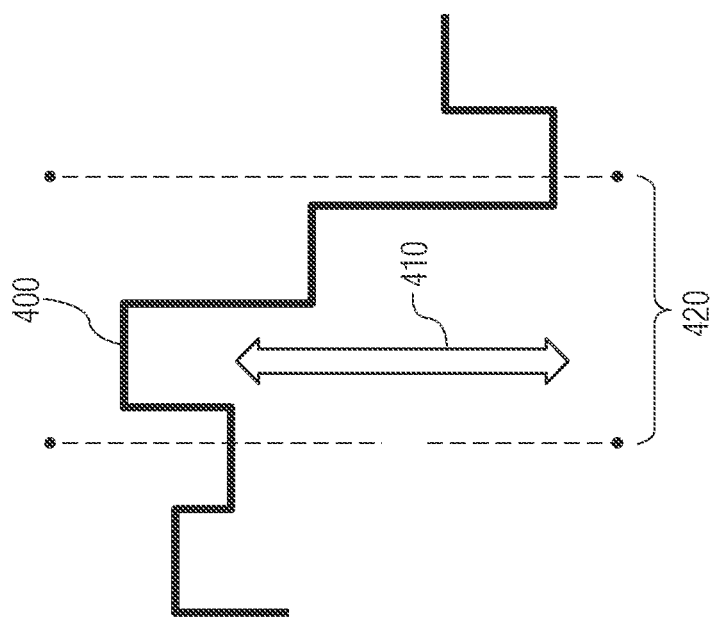
FIG. 4 depicts an example of a digital signal in the receiver unit depicted in FIG. 2 before gain compensation.

FIG. 4 depicts an example of a digital signal 400 of the receiver unit 214 depicted in FIG. 2 (e.g., a digital signal that is generated by the ADC unit 238) before gain compensation, which may be performed by the gain compensation unit 242 depicted in FIG. 2 or the gain compensation unit 342 depicted in FIG. 3. In the digital signal depicted in FIG. 4, a gap 410 in the amplitude of the digital signal is measured during a time window 420. FIG. 5 depicts an example of an amplitude compensated digital signal 500, which is the result of the digital signal 400 FIG. 4 after gain compensation (e.g., performed by the gain compensation unit depicted in FIG. 2 or the gain compensation unit depicted in FIG. 3). In the digital signal 500 depicted in FIG. 5, the gap 410 in the amplitude of the digital signal is removed during the time window 420 and the signal amplitude of the digital signal is kept at a fixed value during the time window.

Figure 6:
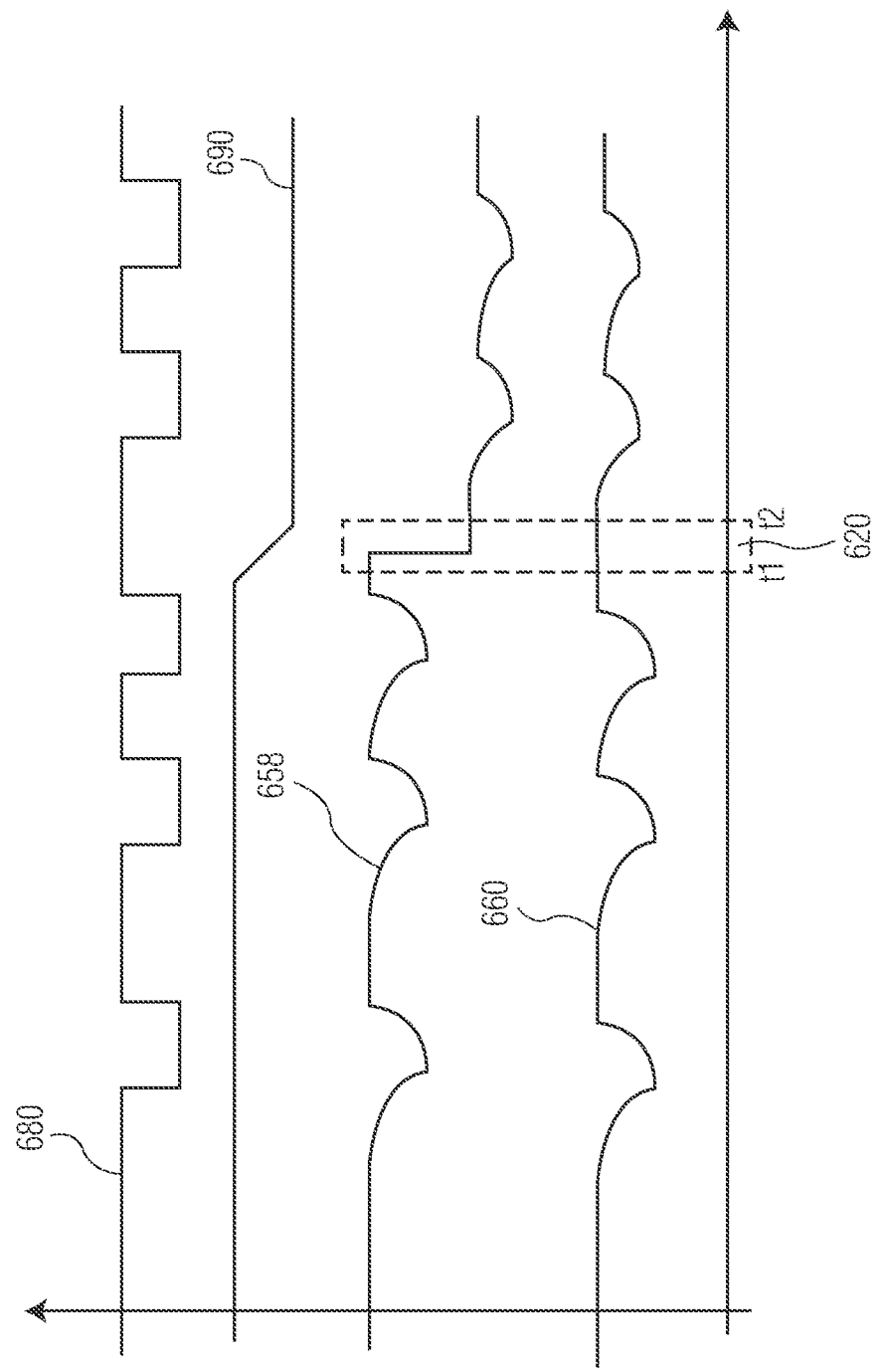
FIG. 6 depicts a signal timing diagram for the receiver unit depicted in FIG. 2.

FIG. 6 depicts a signal timing diagram for the receiver unit 214 depicted in FIG. 2. In the signal timing diagram illustrated in FIG. 6, the signal envelope 680 of the RF signal 250 that is received at the receiver unit 214, an amplification gain 690 of the amplifier 236 depicted in FIG. 2 that is set by the gain control unit 240 depicted in FIG. 2, a digital signal 658 that is generated by the ADC unit 238 depicted in FIG. 2, and an amplitude compensated digital signal 660 that is generated by the gain compensation unit 242 depicted in FIG. 2 or the gain compensation unit 342 depicted in FIG. 3 are shown. At time point, t1, a time window 620 in which the change in the amplification gain affects the amplitude of the digital signal starts. At time point, t2, the time window in which the change in the amplification gain affects the amplitude of the digital signal ends. During the time window, the amplitude of the digital signal is frozen, and a gap in the amplitude of the digital signal during the time window that is caused by the change in the amplification gain is measured and subsequently removed. Because the gap in the amplitude of the digital signal that is caused by the change in the amplification gain is removed, decoding errors that are caused by a change in the signal envelope of the digital signal (e.g., the amplitude decreases of the digital signal in the time window 620) can be reduced or avoided.

Figure 7:
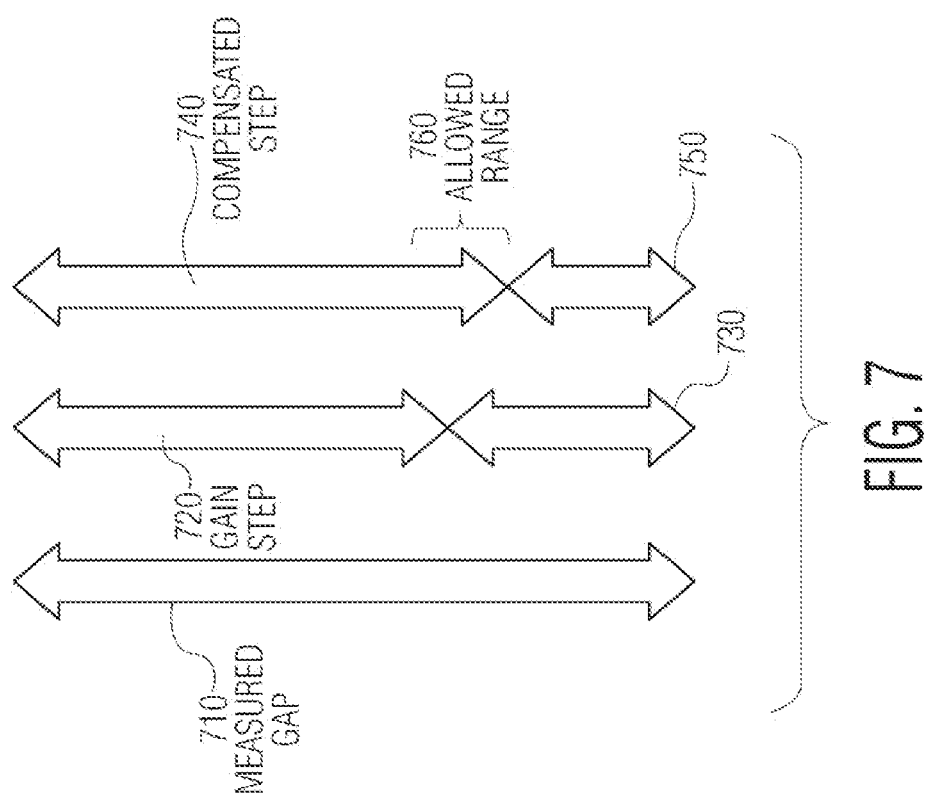
FIG. 7 depicts a gap in an amplitude of a digital signal of the receiver unit depicted in FIG. 2 that is caused by an amplification gain change and a signal edge.

A change in the amplification gain of the amplifier 236 in the receiver unit 214 depicted in FIG. 2 can occur at various time points. For example, the gain control unit 240 can change the amplification gain of the amplifier at any time point prior to a start of a data frame reception in the receiver unit. In some embodiments, during a data frame reception in the receiver unit, the gain control unit changes the amplification gain at a different time point when a signal edge occurs in order to increase system sensitivity. For example, the gain control unit can detect a signal bitgrid (time points when signal edges can occur) based on a received start of frame (SoF) data field and change the amplification gain outside the signal bitgrid to ensure that a gain step and a signal edge cannot occur at the same time. However, in some embodiments, an amplification gain change (i.e., a gain step) and a signal edge occur at the same time. For example, before the signal bitgrid is known to the gain control unit (e.g., before a start of frame (SoF) data field is received at the receiver unit), the gain control unit may, by chance, change the amplification gain at a time point when a signal edge occurs. In these embodiments, the amplification gain change can be compensated for. However, the amplification gain compensation is limited to an allowed range. FIG. 7 depicts a gap 710 in the amplitude of the digital signal 258 that is generated by the ADC unit 238 of the receiver unit 214 depicted in FIG. 2 that is caused by an amplification gain change and a signal edge. The gap in the amplitude of the digital signal is measured during a time window. As shown in FIG. 7, before the amplitude compensation, the measured amplitude gap during the time window is equivalent to the sum of the amplitude gap 720 caused by the amplification gain change and the amplitude gap 730 caused by the signal edge. Amplitude compensation, which may be performed by the gain compensation unit depicted in FIG. 2 or the gain compensation unit depicted in FIG. 3, can change the amplitude gap within an allowed range without masking out the signal edge. After amplitude compensation, the measured amplitude gap during the time window is equivalent to the sum of an adjusted amplitude gap 740, which is the amplitude gap 720 adjusted by an allowed range 760, and a residual amplitude gap 750 to be processed by the DSP unit 244.

Figure 8:
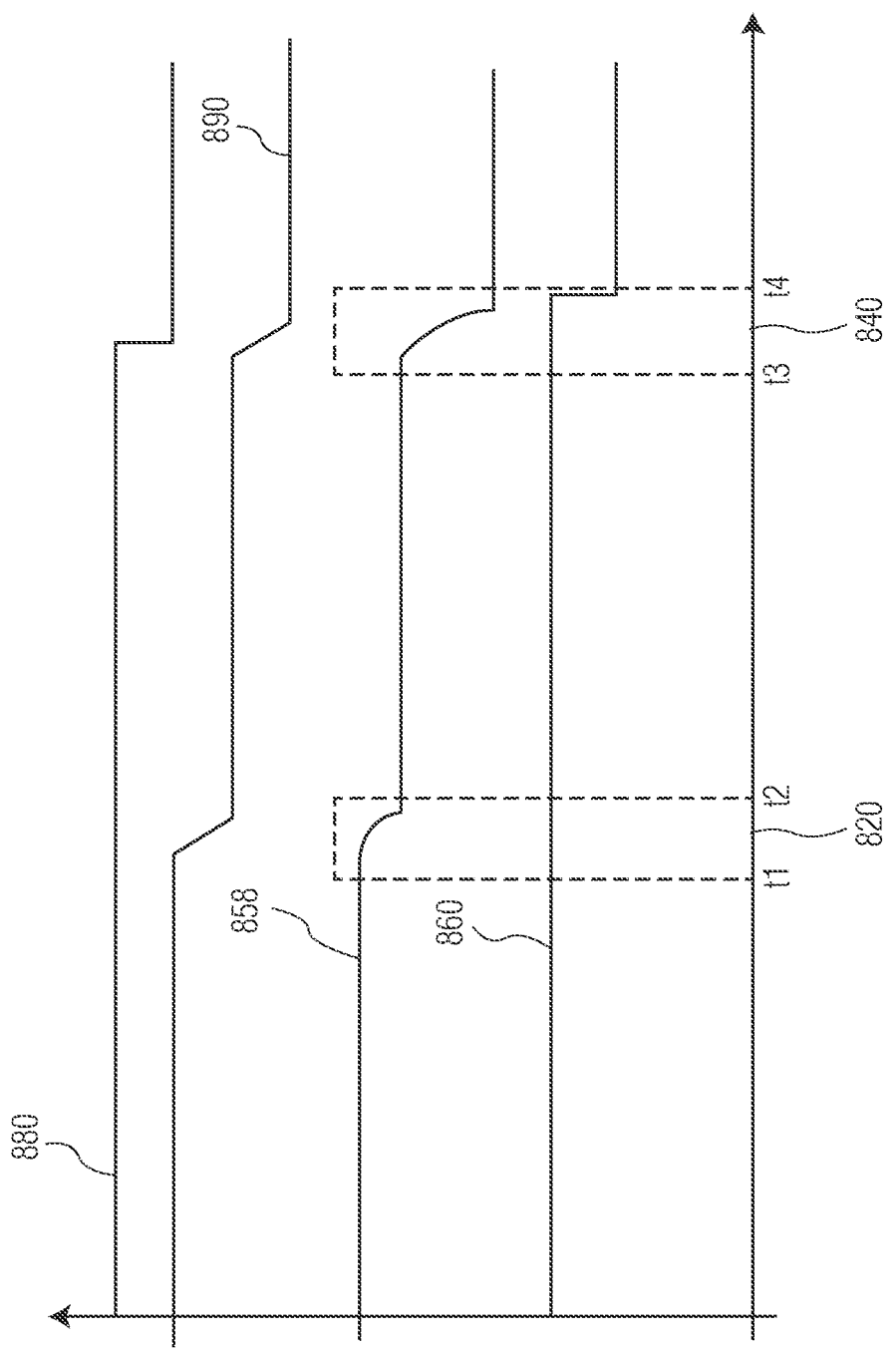
FIG. 8 depicts a signal timing diagram for the receiver unit depicted in FIG. 2 in which a gain step is added to a signal edge.

FIG. 8 depicts a signal timing diagram for the receiver unit 214 depicted in FIG. 2 in which a gain step is added to a signal edge. In the signal timing diagram illustrated in FIG. 8, a signal envelope 880 for the RF signal 250 that is received at the receiver unit, an amplification gain 890 for the amplifier 236 depicted in FIG. 2 that is set by the gain control unit 240, a digital signal 858 that is generated by the ADC unit 238 depicted in FIG. 2, and a gain compensated digital signal 860 that is generated by the gain compensation unit 242 depicted in FIG. 2 or the gain compensation unit 342 depicted in FIG. 3 are shown. At time point, t1, a first-time window 820 in which the change in the amplification gain affects the amplitude of the digital signal starts. At time point, t2, the first-time window in which the change in the amplification gain affects the amplitude of the digital signal ends. During the first-time window, the amplitude of the digital signal is frozen, and a gap in the amplitude of the digital signal during the first-time window that is caused by the change in the amplification gain is measured and subsequently removed such that the amplitude of the digital signal stays flat (i.e., fixed). Because the gap in the amplitude of the digital signal that is caused by the change in the amplification gain is removed, decoding errors that are caused by a change in the signal envelope of the digital signal (e.g., the amplitude decreases of the digital signal in the first-time window 820) can be reduced or avoided. At time point, t3, a second-time window 840 in which the change in the amplification gain affects the amplitude of the digital signal starts. At time point, t4, the second-time window ends. During the second-time window, the amplitude of the digital signal is frozen, and a gap in the amplitude of the digital signal during the second-time window that is caused by the change in the amplification gain is measured and subsequently removed such that the amplitude of the digital signal decreases to a predetermined fixed level. Because the gap in the amplitude of the digital signal that is caused by the change in the amplification gain is removed, decoding errors that are caused by a change in the signal envelope of the digital signal (e.g., the amplitude decreases of the digital signal in the second-time window 840) can be reduced or avoided.

Figure 9:
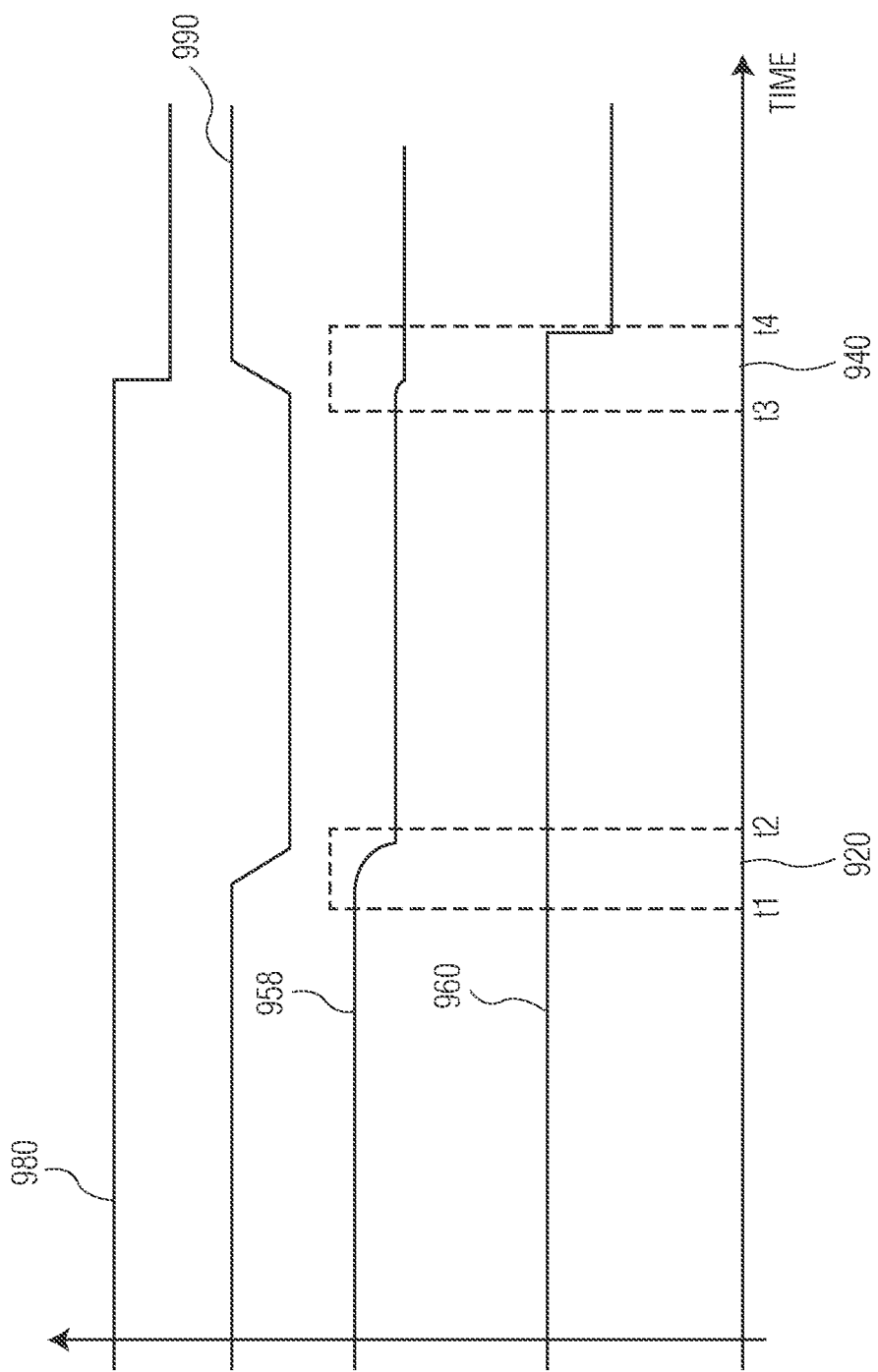
FIG. 9 depicts a signal timing diagram for the receiver unit depicted in FIG. 2 in which a gain step compensates a signal edge.

FIG. 9 depicts a signal timing diagram for the receiver unit 214 depicted in FIG. 2 in which a gain step compensates a signal edge. In the signal timing diagram illustrated in FIG. 9, a signal envelope 980 for the RF signal 250 that is received at the receiver unit, an amplification gain 990 for the amplifier 236 depicted in FIG. 2 that is set by the gain control unit 240, a digital signal 958 that is generated by the ADC unit 238 depicted in FIG. 2, and a gain compensated digital signal 960 that is generated by the gain compensation unit 242 depicted in FIG. 2 or the gain compensation unit 342 depicted in FIG. 3 are shown. At time point, t1, a first-time window 920 in which the change in the amplification gain affects the amplitude of the digital signal starts. At time point, t2, the first-time window ends. During the first-time window, the amplitude of the digital signal is frozen, and a gap in the amplitude of the digital signal during the first-time window that is caused by the change in the amplification gain is measured and subsequently removed such that the amplitude of the digital signal stays flat (i.e., fixed). Because the gap in the amplitude of the digital signal that is caused by the change in the amplification gain is removed, decoding errors that are caused by a change in the signal envelope of the digital signal (e.g., the amplitude decreases of the digital signal in the first-time window 920) can be reduced or avoided. At time point, t3, a second-time window 940 in which the change in the amplification gain affects the amplitude of the digital signal starts. At time point, t4, the second-time window ends. During the second-time window, the amplitude of the digital signal is frozen, and a gap in the amplitude of the digital signal during the second-time window that is caused by the change in the amplification gain is measured and subsequently adjusted such that the amplitude of the digital signal decreases to a predetermined fixed level. Because the gap in the amplitude of the digital signal that is caused by the change in the amplification gain is adjusted, decoding errors that are caused by an actual signal edge that is masked out by an amplitude step in the digital signal (e.g., the lower-than-expected amplitude decrease of the digital signal in the second time window 940) can be reduced or avoided.

Figure 10:
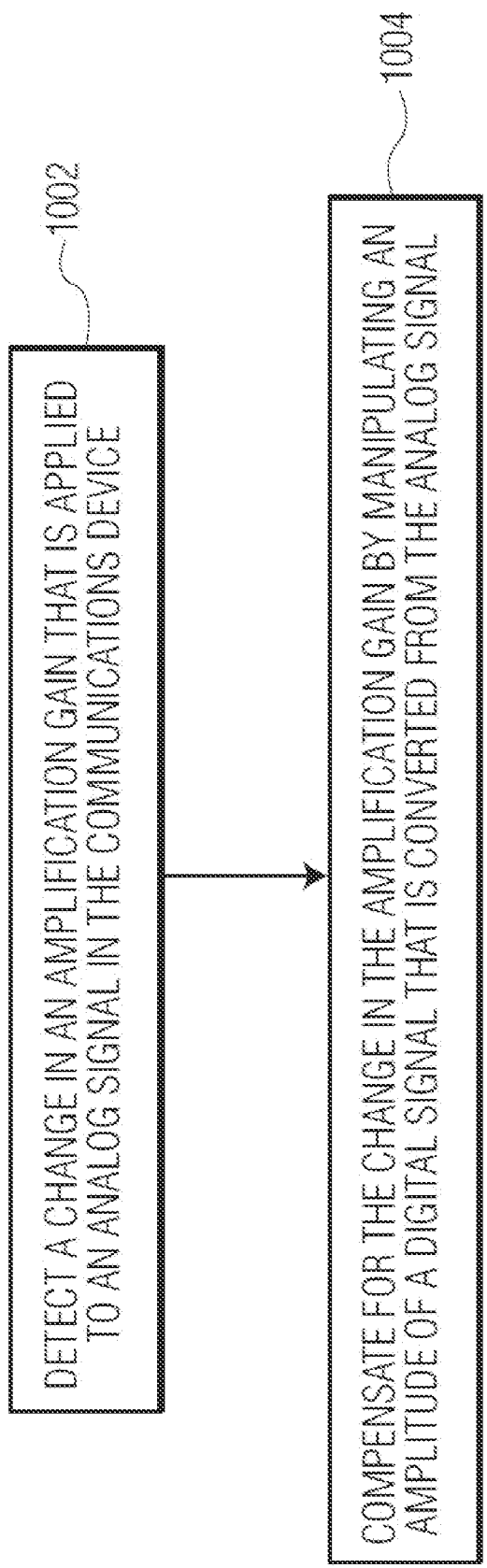
FIG. 10 is a process flow diagram of a method for gain control in a communications device in accordance with another embodiment of the invention.

FIG. 10 is a process flow diagram of a method for gain control in a communications device in accordance with another embodiment of the invention. At block 1002, detecting a change in an amplification gain that is applied to an analog signal in the communications device. At block 1004, the change in the amplification gain is compensated for by manipulating an amplitude of a digital signal that is converted from the analog signal. The communications device may be the same or similar to communications devices depicted with reference to FIGS. 1-9.

Figure 11:
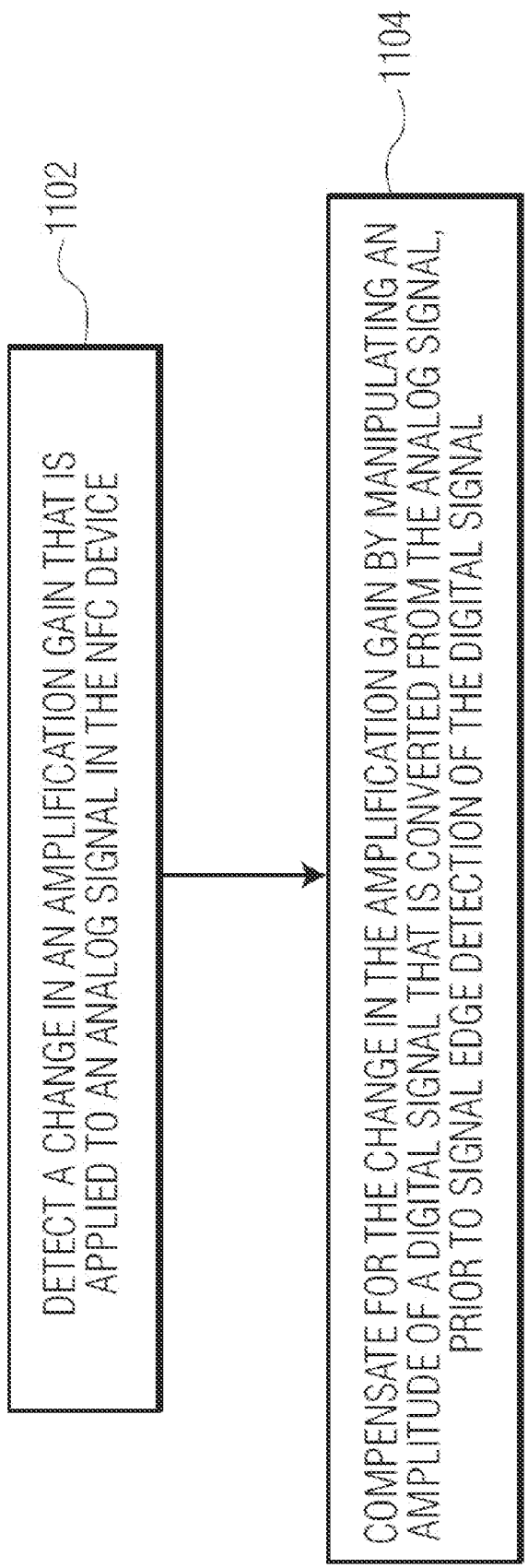
FIG. 11 is a process flow diagram of a method for gain control in a near field communications (NFC) device in accordance with another embodiment of the invention Throughout the description, similar reference numbers may be used to identify similar elements.

FIG. 11 is a process flow diagram of a method for gain control in an NFC device in accordance with another embodiment of the invention. At block 1102, a change in an amplification gain that is applied to an analog signal in the NFC device is detected. At block 1104, the change in the amplification gain is compensated for by manipulating an amplitude of a digital signal that is converted from the analog signal, prior to signal edge detection of the digital signal. The NFC device may be the same or similar to communications devices depicted with reference to FIGS. 1-9.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

The computer-useable or computer-readable medium can be an electronic, magnetic, optical, electromagnetic, infrared, or semiconductor system (or apparatus or device), or a propagation medium. Examples of a computer-readable medium include a semiconductor or solid-state memory, magnetic tape, a removable computer diskette, a random-access memory (RAM), a read-only memory (ROM), a rigid magnetic disc, and an optical disc. Current examples of optical discs include a compact disc with read only memory (CDROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

The invention claimed is:

1. A method for gain control in a communications device, the method comprising:
   detecting a change in an amplification gain that is applied to an analog signal in the communications device; and
   compensating for the change in the amplification gain by manipulating an amplitude of a digital signal that is converted from the analog signal, wherein compensating for the change in the amplification gain by manipulating the amplitude of the digital signal that is converted from the analog signal comprises:
      freezing the amplitude of the digital signal during a time window in which the change in the amplification gain affects the amplitude of the digital signal;
      measuring a gap in the amplitude of the digital signal during the time window that is caused by the change in the amplification gain; and
      removing the gap in the amplitude of the digital signal during the time window.

2. The method of claim 1, wherein compensating for the change in the amplification gain by manipulating the amplitude of the digital signal that is converted from the analog signal comprises manipulating the amplitude of the digital signal prior to a start of a data frame reception.

3. The method of claim 1, wherein compensating for the change in the amplification gain by manipulating the amplitude of the digital signal that is converted from the analog signal comprises manipulating the amplitude of the digital signal during a data frame reception.

4. The method of claim 1, wherein compensating for the change in the amplification gain by manipulating the digital signal that is converted from the analog signal comprises compensating for the change in the amplification gain by manipulating the digital signal prior to signal edge detection of the digital signal.

5. The method of claim 1, wherein the analog signal is a baseband analog signal that is converted from a Radio frequency (RF) signal.

6. The method of claim 1, wherein the communications device is a near field communications (NFC) device.

7. A communications device, the communications device comprising:
   a gain compensation timing unit configured to detect a change in an amplification gain that is applied to an analog signal in the communications device; and
   a signal amplitude control unit configured to compensate for the change in the amplification gain by manipulating an amplitude of a digital signal that is converted from the analog signal, wherein the signal amplitude control unit is further configured to:
      freeze the amplitude of the digital signal during a time window in which the change in the amplification gain affects the amplitude of the digital signal;
      measure a gap in the amplitude of the digital signal during the time window that is caused by the change in the amplification gain; and
      remove the gap in the amplitude of the digital signal during the time window.

8. The communications device of claim 7, wherein the signal amplitude control unit is further configured to manipulate the amplitude of the digital signal prior to a start of a data frame reception.

9. The communications device of claim 7, wherein the signal amplitude control unit is further configured to manipulate the amplitude of the digital signal during a data frame reception.

* * * * *